(12) United States Patent
Kato et al.

(10) Patent No.: US 12,142,559 B2
(45) Date of Patent: Nov. 12, 2024

(54) SEMICONDUCTOR DEVICE COMPRISING A CAPACITOR

(71) Applicant: FUJI ELECTRIC CO., LTD., Kawasaki (JP)

(72) Inventors: Ryoichi Kato, Matsumoto (JP); Yoshinari Ikeda, Matsumoto (JP); Yuma Murata, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 0 days.

(21) Appl. No.: 18/469,840

(22) Filed: Sep. 19, 2023

(65) Prior Publication Data

US 2024/0006303 A1    Jan. 4, 2024

Related U.S. Application Data

(60) Division of application No. 17/883,074, filed on Aug. 8, 2022, now Pat. No. 11,887,925, which is a
(Continued)

(30) Foreign Application Priority Data

Dec. 27, 2019   (JP) .................. 2019-237613

(51) Int. Cl.
*H01L 23/522*   (2006.01)
*H01L 23/49*    (2006.01)
*H01L 23/498*   (2006.01)
*H01L 25/16*    (2023.01)
(Continued)

(52) U.S. Cl.
CPC .......... *H01L 23/5222* (2013.01); *H01L 23/49* (2013.01); *H01L 23/49811* (2013.01);
(Continued)

(58) Field of Classification Search
CPC .................................. H01L 23/4924
(Continued)

(56) References Cited

U.S. PATENT DOCUMENTS 7,187,568 B2 * 3/2007 Radosevich ....... H05K 7/20927
                                                361/699
7,791,208 B2   9/2010 Bayerer
(Continued)

FOREIGN PATENT DOCUMENTS

JP   2004128099 A   4/2004
JP   2006165409 A   6/2006
(Continued)

OTHER PUBLICATIONS

Japanese Patent Office Action issued on Oct. 10, 2023, for corresponding Japanese Patent Application No. 2019-237613.

*Primary Examiner* — Ajay Arora
(74) *Attorney, Agent, or Firm* — Rabin & Berdo, P.C.

(57) ABSTRACT

A capacitor includes a case including a capacitor element, a first connection terminal, a second connection terminal, and a second insulating sheet formed between the first connection terminal and the second connection terminal, and the first connection terminal, the second insulating sheet, and the second connection terminal extend to the outside from the case. A semiconductor module includes a multi-layer terminal portion in which a first power terminal, a first insulating sheet, and a second power terminal are sequentially stacked. The first power terminal includes a first bonding area electrically connected to the first connection terminal, and the second power terminal includes a second bonding area electrically connected to the second connection terminal. The first insulating sheet includes a terrace portion that extends in a direction from the second bonding area towards the first bonding area in a planar view.

5 Claims, 12 Drawing Sheets

Related U.S. Application Data continuation of application No. 17/107,552, filed on Nov. 30, 2020, now Pat. No. 11,410,922.

(51) Int. Cl.
*H01R 4/02* (2006.01)
*H01R 43/02* (2006.01)

(52) U.S. Cl.
CPC .......... *H01L 25/162* (2013.01); *H01R 4/029* (2013.01); *H01R 43/0221* (2013.01)

(58) Field of Classification Search
USPC ...................................................... 257/677
See application file for complete search history.

(56) References Cited

U.S. PATENT DOCUMENTS

| | | | |
|---|---|---|---|
| 9,078,372 B2* | 7/2015 | Huang | H05K 7/1432 |
| 10,090,774 B1 | 10/2018 | Beckedahl et al. | |
| 2008/0049476 A1 | 2/2008 | Azuma et al. | |
| 2009/0002956 A1 | 1/2009 | Suwa et al. | |
| 2010/0025126 A1 | 2/2010 | Nakatsu et al. | |
| 2010/0157640 A1 | 6/2010 | Azuma et al. | |
| 2015/0131232 A1 | 5/2015 | Ishino et al. | |
| 2016/0366778 A1 | 12/2016 | Liu et al. | |
| 2018/0174934 A1 | 6/2018 | Tani | |
| 2020/0169186 A1 | 5/2020 | Manser et al. | |
| 2020/0281087 A1* | 9/2020 | Schmid | H05K 7/14329 |

FOREIGN PATENT DOCUMENTS

| | | |
|---|---|---|
| JP | 2007234694 A | 9/2007 |
| JP | 2009005512 A | 1/2009 |
| JP | 2009081993 A | 4/2009 |
| JP | 2010035347 A | 2/2010 |
| JP | 2014011339 A | 1/2014 |
| JP | 2017005241 A | 1/2017 |
| JP | 2018190965 A | 11/2018 |
| WO | 2017072870 A1 | 5/2017 |

* cited by examiner

SEMICONDUCTOR DEVICE COMPRISING A CAPACITOR

CROSS-REFERENCE TO RELATED APPLICATION

This is a division application of U.S. application Ser. No. 17/883,074 filed on Aug. 8, 2022, which is a continuation application of U.S. application Ser. No. 17/107,552 filed on Nov. 30, 2020 (now U.S. Pat. No. 11,410,922 issued on Aug. 9, 2022), which is based upon and claims the benefit of priority of the prior Japanese Patent Application No. 2019-237613, filed on Dec. 27, 2019, the entire contents of which are incorporated herein by reference.

BACKGROUND OF THE INVENTION

1. Field of the Invention

The embodiments discussed herein relate to a semiconductor device.

2. Background of the Related Art

There is a semiconductor device that includes a semiconductor module and a capacitor. The semiconductor module and the capacitor are electrically connected to each other. The semiconductor module includes power devices and has a power conversion function, for example. The power devices are IGBTs (Insulated Gate Bipolar Transistors) or MOSFETs (Metal Oxide Semiconductor Field Effect Transistors), for example. In such a semiconductor device, P and N terminals of a semiconductor module and P and N terminals of a capacitor are connected to each other; a bus bar. This connection has conventionally been made by screwing, to facilitate the connection process. However, if this connection method is used, the length of an individual wiring between the semiconductor module and the capacitor could be extended, and the inductance could be increased as a result. There has been proposed a connection method that achieves the connection more easily without using screws and reduces the inductance (see, for example, Japanese Laid-open Patent Publication No. 2007-234694).

According to Japanese Laid-open Patent Publication No. 2007-234694, reduction of the inductance is expected by the connection mechanism on the semiconductor module side. However, this publication discusses no specific connection mechanism on the capacitor side. Thus, not much reduction of the inductance is expected. Namely, it is thought that the effect of the reduction of the inductance is small as the entire semiconductor device.

SUMMARY OF THE INVENTION

In one aspect of the embodiments, there is provided a semiconductor device including a capacitor including a case having a capacitor element therein, and a first connection terminal, a second connection terminal and a flexible insulating member disposed between the first connection terminal and the second connection terminal, wherein the first connection terminal, the flexible insulating member, and the second connection terminal extend outside the case from inside; and a semiconductor module including a multi-layer terminal portion in which a first power terminal, a first insulating member, and a second power terminal are sequentially stacked, wherein the first power terminal includes a first bonding area electrically connected to the first connection terminal, the second power terminal includes a second bonding area electrically connected to the second connection terminal, the first bonding area being apart from the second bonding area in a plan view of the semiconductor device, and the first insulating member includes a terrace portion extending from the second bonding area toward the first bonding area in the plan view.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1:
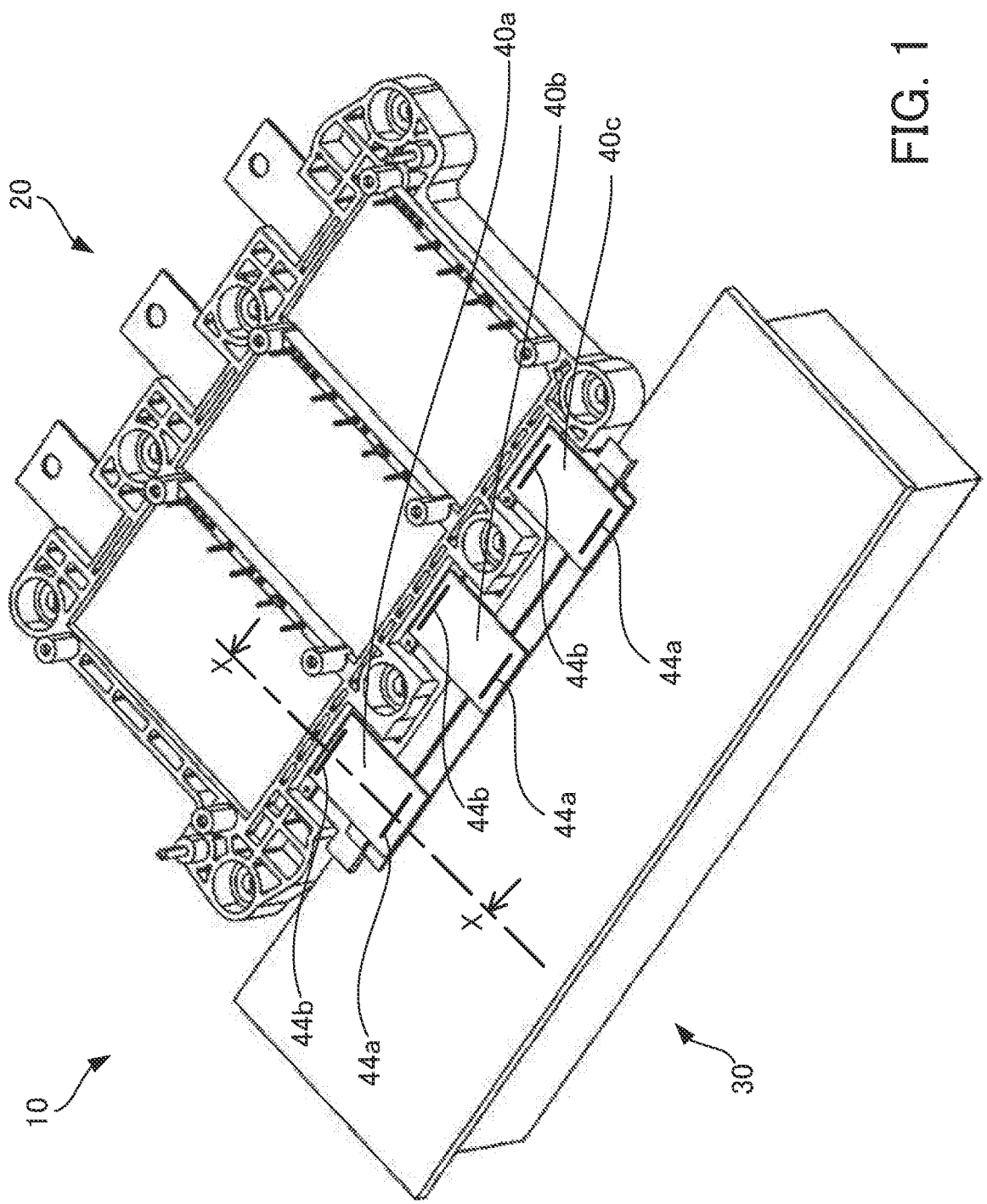
FIG. 1 illustrates a semiconductor device according to a first embodiment.

Hereinafter, embodiments will be described with reference to the accompanying drawings. In the following description, regarding a semiconductor device 10 in FIG. 1, terms "front surface" and "top surface" each mean a surface facing upwards. Likewise, regarding the semiconductor device 10 in FIG. 1, a term "up" means an upward direction. In addition, regarding a semiconductor device 10 in FIG. 1, terms "rear surface" and "bottom surface" each mean a surface facing downwards. Likewise, regarding the semiconductor device 10 in FIG. 1, a term "down" means a downward direction. In the drawings other than FIG. 1, the above terms mean their respective directions, as needed. The terms "front surface", "top surface", "up", "rear surface", "bottom surface", "down", and "side surface" are only expressions used for the purpose of convenience to determine a relative positional relationship and do not limit the technical concept of the embodiments. For example, the terms "up" and "down" do not necessarily mean a vertical direction with respect to the ground. Namely, the directions expressed by "up" and "down" are not limited to the directions relating to the gravity.

First Embodiment

A semiconductor device according to a first embodiment will be described with reference to FIG. 1. FIG. 1 illustrates a semiconductor device according to the first embodiment. This semiconductor device 10 includes a semiconductor module 20 and a capacitor 30. In FIG. 1, the semiconductor module 20 and the capacitor 30 are disposed as close to each other as possible so that their sides face each other. Coupling members 40a, 40b, and 40c electrically and physically connect, and mechanically couple the semiconductor module 20 and the capacitor 30 with each other. Each of these coupling members 40a, 40b, and 40c has a linear laser welding mark 44a on its edge close to the capacitor 30 and a linear laser welding mark 44b on its edge close to the semiconductor module 20. These laser welding marks 44a and 44b will be described below. The number of coupling members 40a, 40b, 40c and the width thereof are only examples. The number of coupling members 40a, 40b, 40c and the width thereof are selected based on the number of multi-layer terminal portions 25a, 25b, and 25c (which will be described below) and the width thereof included in the semiconductor module 20. Hereinafter, when the coupling members 40a, 40b, and 40c do not need to be distinguished from each other, any one of the coupling members will simply be referred to as a coupling member 40, as needed. Likewise, when the multi-layer terminal portions 25a, 25b, and 25c do not need to be distinguished from each other, any one of the multi-layer terminal portions will simply be referred to as a multi-layer terminal portion 25, as needed.

Figure 2:
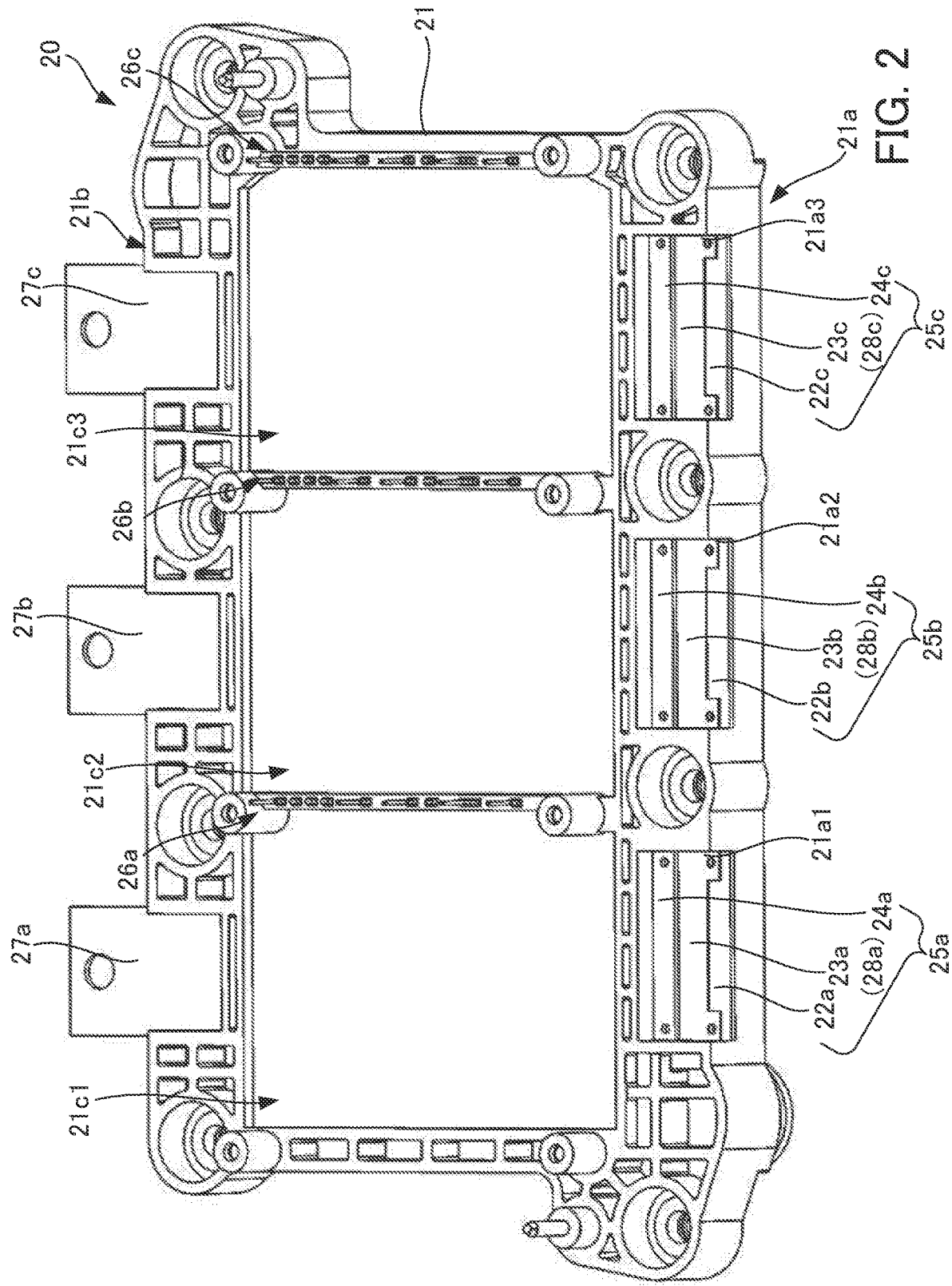
FIG. 2 illustrates a semiconductor module according to the first embodiment.
Figure 3:
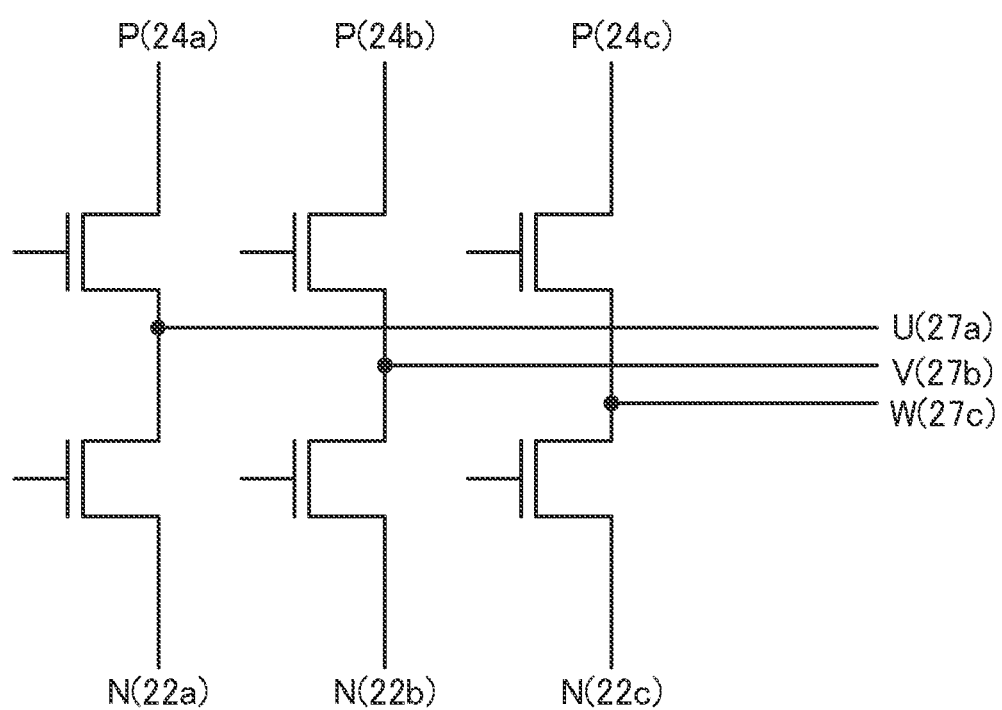
FIG. 3 illustrates an equivalent circuit configured by the semiconductor module of the semiconductor device according to the first embodiment.

Next, the semiconductor module 20 included in the semiconductor device 10 will be described with reference to FIGS. 2 and 3. FIG. 2 illustrates the semiconductor module according to the first embodiment, and FIG. 3 illustrates an equivalent circuit configured by the semiconductor module of the semiconductor device according to the first embodiment.

The semiconductor module 20 includes semiconductor units (not illustrated) and a case 21 in which the semiconductor units are stored. Each of the semiconductor units includes a ceramic circuit board and a semiconductor chip formed on the ceramic circuit board. The ceramic circuit board includes an insulating plate, a heat radiation plate formed on the rear surface of the insulating plate, and a circuit pattern formed on the front surface of the insulating plate. The insulating plate is made of ceramic material having excellent thermal conductivity. Examples of this ceramic material include aluminum oxide, aluminum nitride, and silicon nitride having high-temperature conductivity. The heat radiation plate is made of metal material having excellent thermal conductivity. Examples of the metal material include aluminum, iron, silver, copper, and an alloy containing at least one kind of these elements. The circuit pattern is made of metal material having excellent electrical conductivity. Examples of the metal material include copper and a copper alloy. The number of circuit patterns and the shape thereof are suitably selected based on the specifications of the semiconductor module 20, for example. For example, a DCB (Direct Copper Bonding) substrate or an AMB (Active Metal Brazed) substrate may be used as the ceramic circuit board having the above configuration.

The semiconductor chip is made of silicon or silicon carbide and includes, for example, a switching element such as an IGBT or a power MOSFET. This semiconductor chip includes, for example, a drain electrode (or a collector diode) as a main electrode on its rear surface and a gate electrode and a source electrode (or an emitter electrode) as main electrodes on its front surface. As needed, the semiconductor chip includes, for example, a freewheeling diode (FWD) such as a Schottky barrier diode (SBD) or a P-intrinsic-N (PiN) diode. This semiconductor chip includes a cathode electrode as a main electrode on its rear surface and an anode electrode as a main electrode on its front surface. Alternatively, an RC (Reverse-Conducting)-IGBT having functions of both an IGBT and an FWD may be used as the semiconductor chip. The number of semiconductor chips and the kind thereof are also suitably selected based on the specifications of the semiconductor module 20.

The case 21 includes storage areas 21c1, 21c2, and 21c3. In addition, the case 21 includes first power terminals 22a, 22b, and 22c, first insulating sheets (first insulating member) 23a, 23b, and 23c, and second power terminals 24a, 24b, and 24c. In addition, the case 21 includes a U terminal 27a, a V terminal 27b, and a W terminal 27c. This case 21 is formed by injection molding using thermal flexible resin. In addition, control terminals 26a, 26b, and 26c are attached to side portions of the storage areas 21c1, 21c2, and 21c3 of the case 21 (in parallel with the lateral direction of the case 21), respectively. For example, the thermal flexible resin is polyphenylenesulfide (PPS), polybutyleneterephthalate (PBT) resin, polybutylene succinate (PBS) resin, polyamide (PA) resin, or acrylonitrile butadiene styrene (ABS) resin. The control terminals 26a, 26b, and 26c are also formed by injection molding using thermal flexible resin, including predetermined terminals. When the storage areas 21c1, 21c2, and 21c3 do not need to be distinguished from each other, any one of these storage areas will simply be referred to as a storage areas 21c. Likewise, when the first power terminals 22a, 22b, and 22c do not need to be distinguished from each other, any one of these first power terminals will simply be referred to as a first power terminal 22. Likewise, when the second power terminals 24a, 24b, and 24c do not need to be distinguished from each other, any one of the second power terminals will simply be referred to as a second power terminal 24. Likewise, the first insulating sheets 23a, 23b, and 23c to be described below will simply be referred to as a first insulating sheet 23.

Each of the storage areas 21c1, 21c2, and 21c3 is a space formed in the middle portion of the case 21 in the longitudinal direction thereof in a planar view. Each of the storage areas 21c1, 21c2, and 21c3 includes a semiconductor unit described above. The semiconductor unit inside the storage area 21cl is electrically connected to the first power terminal 22a, the second power terminal 24a, and the U terminal 27a. The semiconductor unit inside the storage area 21c2 is electrically connected to the first power terminal 22b, the second power terminal 24b, and the V terminal 27b. The semiconductor unit inside the storage area 21c3 is electrically connected to the first power terminal 22c, the second power terminal 24c, and the W terminal 27c. The semiconductor units are also electrically connected to their respective control terminals 26a, 26b, and 26c. For this electrical connection, wiring members such as bonding wires or lead frames are used. The wiring members are made of material having excellent electrical conductivity. Examples of the material include metal material such as aluminum or copper and an alloy containing at least one kind of these elements. After the semiconductor units are stored in their respective storage areas 21c1, 21c2, and 21c3, the inside of each of the storage areas 21c1, 21c2, and 21c3 is sealed by sealing resin, as illustrated in FIG. 2. The sealing material includes thermosetting resin and filler included therein. Examples of the thermosetting resin include epoxy resin, phenolic resin, and maleimide resin. Examples of the filler include silicon oxide, aluminum oxide, boron nitride, and aluminum nitride.

An end portion on a front surface of the first power terminal 22a is exposed to the outside in a terminal area 21a1 of the first side portion 21a of the case 21 in the longitudinal direction. An end portion on a front surface of the first power terminal 22b is exposed to the outside in a terminal area 21a2 of the first side portion 21a of the case 21 in the longitudinal direction. An end portion on a front surface of the first power terminal 22c is exposed to the outside in a terminal area 21a3 of the first side portion 21a of the case 21 in the longitudinal direction. Another end portion of each of the first power terminals 22a, 22b, and 22c is electrically connected to a portion corresponding to an N terminal of the corresponding semiconductor chip inside the case 21. The end portion of each of the first power terminals 22a, 22b, and 22c has a planar shape at least near the first side portion 21a. The first power terminals 22a, 22b, and 22c are made of metal material having excellent electrical conductivity. Examples of the metal material include copper and a copper alloy.

While the second power terminals 24a, 24b, and 24c are formed on the first power terminals 22a, 22b, and 22c via the first insulating sheets 23a, 23b, and 23c, the end portion of each of the first power terminals 22a, 22b, and 22c is exposed to the outside. The tip portions (terrace portions 28a, 28b, 28c) of the first insulating sheets 23a, 23b, and 23c are located between the tip portions of the first power terminals 22a, 22b, and 22c and the tip portions of the second power terminals 24a, 24b, and 24c. In this way, the insulation between the first power terminals 22a, 22b, and 22c and the second power terminals 24a, 24b, and 24c is maintained. The first insulating sheets 23a, 23b, and 23c are made of insulating material having insulating properties. For example, insulating paper made of wholly aromatic polyamide polymer or sheet insulating material made of fluorine or polyimide resin material may be used as the insulating material. When the terrace portions 28a, 28b, and 28c do not need to be distinguished from each other, any one of the terrace portions will simply be referred to as a terrace portion 28. The end portion on the front surface of each of the second power terminals 24a, 24b, and 24c is exposed to the outside at the first side portion 21a of the case 21 in the longitudinal direction. Another end portion of each of the second power terminals 24a, 24b, and 24c is electrically connected to a portion corresponding to a P terminal of the corresponding semiconductor chip inside the case 21. Each of the second power terminals 24a, 24b, and 24c has a planar shape at least near the first side portion 21a. The second power terminals 24a, 24b, and 24c are made of metal material having excellent electrical conductivity. Examples of this metal material include copper and a copper alloy.

As described above, the first power terminals 22a, 22b, and 22c, the first insulating sheets 23a, 23b, and 23c, and the second power terminals 24a, 24b, and 24c are sequentially stacked to form the multi-layer terminal portions 25a, 25b, and 25c, respectively. The edge portions on the front surfaces of the first power terminals 22a, 22b, and 22c, the first insulating sheets 23a, 23b, and 23c, and the second power terminals 24a, 24b, and 24c are exposed to the outside near the first side portion 21a. In addition, as will be illustrated in FIG. 5, the tip portions of the first power terminals 22a, 22b, and 22c (the first power terminal 22 in FIG. 5) are separated from the tip portions of the second power terminals 24a, 24b, and 24c (the second power terminal 24 in FIG. 5) by a predetermined distance. Consequently, the creepage distance between the first power terminals 22a, 22b, and 22c and the second power terminals 24a, 24b, and 24c is maintained. This distance differs depending on the withstand voltage value of the semiconductor device 10. The distance is, for example, 3 mm or more and 14.5 mm or less. Alternatively, the distance may be 6 mm or more and 12.5 mm or less. Alternatively, regarding this distance, when the withstand voltage value is 750 V, a tolerance of 0.5 mm may be added to 7.5 mm. When the withstand voltage value is 1,200 V, a tolerance of 0.5 mm may be added to 12 mm. The tip portions of the first insulating sheets 23a, 23b, and 23c are located in this creepage distance.

An end portion of each of the control terminals 26a, 26b, and 26c extends upward in FIG. 2. In addition, another end portion of each of the control terminals 26a, 26b, and 26c is electrically connected to a gate electrode of the semiconductor chip of the semiconductor unit in the corresponding one of the storage areas 21c1, 21c2, and 21c3. The control terminals 26a, 26b, and 26c are made of metal material having excellent electrical conductivity. Examples of this metal material include copper, a copper alloy, aluminum, and an aluminum alloy.

Another end portion of each of the U terminal 27a, the V terminal 27b, and the W terminal 27c is electrically connected to a source electrode (or an emitter electrode) of the semiconductor chip of the semiconductor unit in the corresponding one of the storage areas 21c1, 21c2, and 21c3. One end portion of each of the U terminal 27a, the V terminal 27b, and the W terminal 27c is exposed to the outside at a second side portion 21b of the case 21 in the longitudinal direction of the case 21. The U terminal 27a, the V terminal 27b, and the W terminal 27c are made of metal material having excellent electrical conductivity. Examples of this metal material include copper and a copper alloy.

This semiconductor module 20 includes an equivalent circuit illustrated in FIG. 3. The equivalent circuit in FIG. 3 includes switching elements, and power MOSFETs or IGBTs may be used as the semiconductor chips. In the semiconductor device 10, the second power terminals 24a, 24b, and 24c functioning as P terminals are electrically connected to collector electrodes of semiconductor chips of the semiconductor units in the respective storage areas 21c1, 21c2, and 21c3. The first power terminals 22a, 22b, and 22c functioning as N terminals are electrically connected to emitter electrodes of semiconductor chips of the semiconductor units in the respective storage areas 21c1, 21c2, and 21c3. The U terminal 27a, the V terminal 27b, and the W terminal 27c are electrically connected to the connecting points of semiconductor chips connected in series in the semiconductor units in the respective storage areas 21c1, 21c2, and 21c3.

Figure 4B:
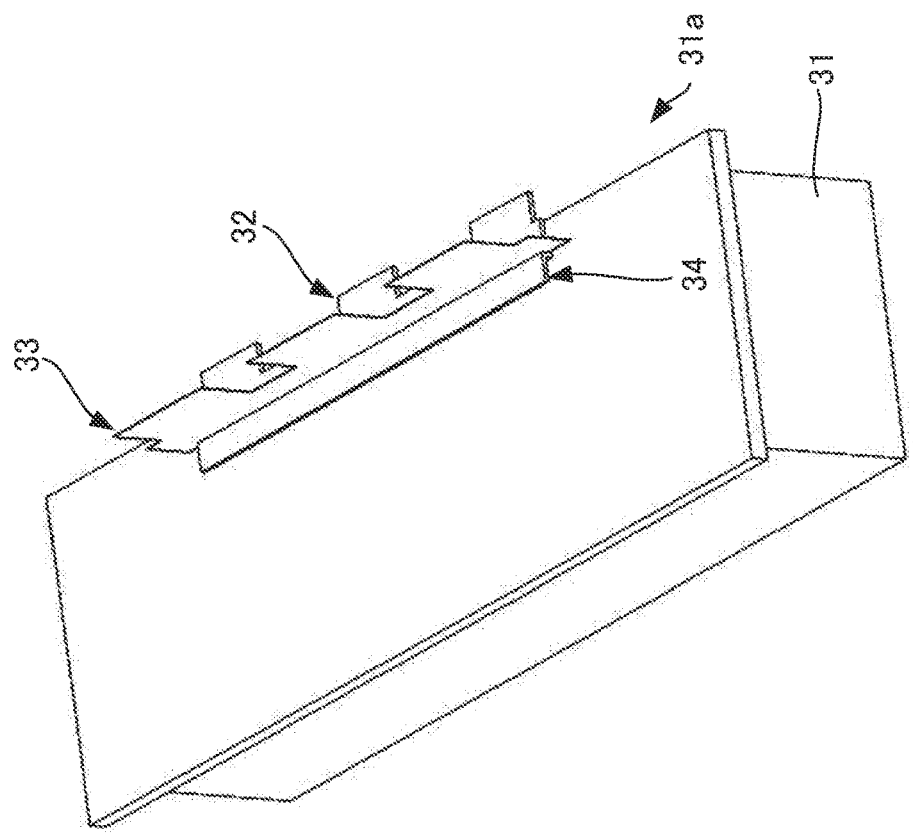
FIGS. 4A and 4B illustrate a capacitor according to the first embodiment.
Figure 4A:
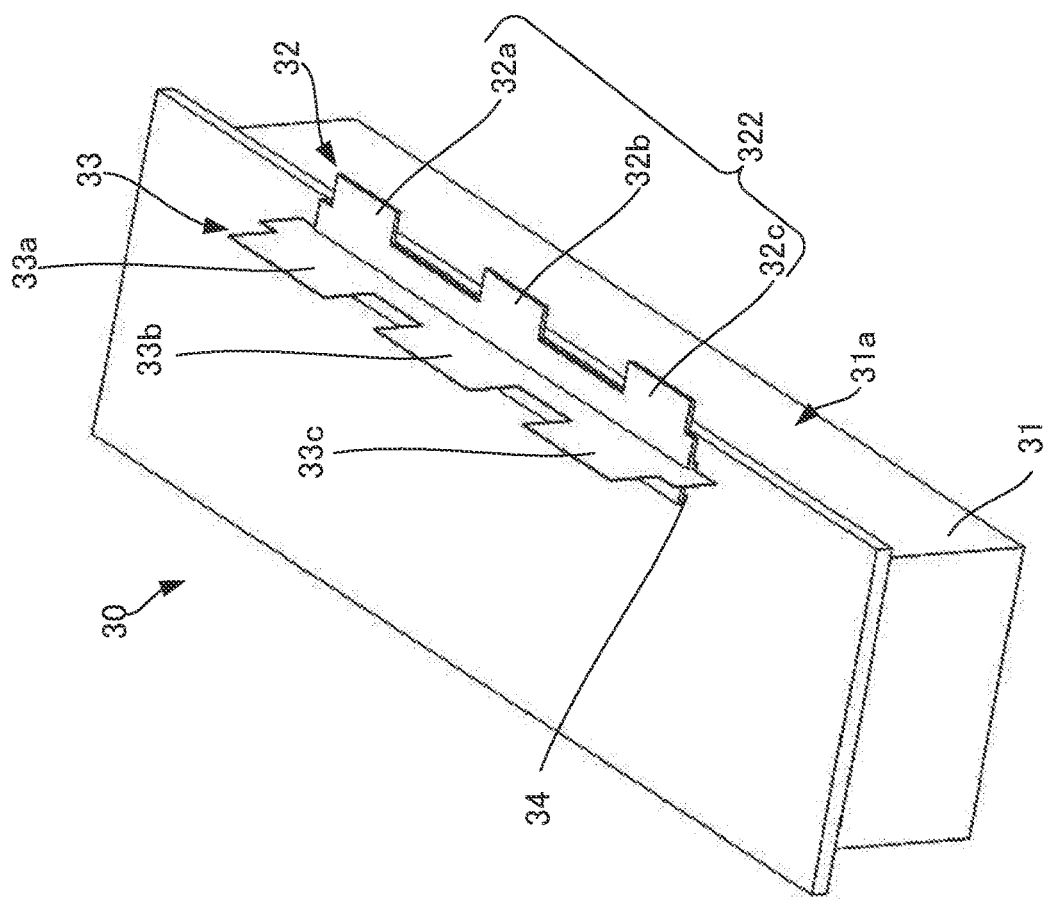

Next, the capacitor 30 will be described with reference to FIGS. 4A and 4B. FIGS. 4A and 4B illustrate the capacitor according to the first embodiment. FIG. 4A is a perspective view of the capacitor 30, and FIG. 4B is a perspective view of the capacitor 30 seen from an opposite direction from that in FIG. 4A. The capacitor 30 includes a case 31, a first connection terminal 32, a second insulating sheet (flexible insulating member) 33, and a second connection terminal 34.

The case 31 is the main body of the capacitor. For example, the case 31 holds a plurality of capacitor elements, each of which is formed by stacking and winding a pair of film dielectrics and connecting the film dielectrics to positive and negative electrodes. Thus, the case 31 maintains insulation from the capacitor elements and is made of lightweight material. This material is epoxy resin, for example. Another end portion of the first connection terminal 32 is electrically connected to the N electrodes of all the capacitor elements inside the case 31. An end portion of the first connection terminal 32 extends to the outside from the front surface of the case 31. This portion of the first connection terminal 32 extending from the case 31 has an approximately L shape in a lateral view. The first connection terminal 32 having the approximately L shape includes a first conductive portion 321 and a first wiring portion 322, as will be described below with reference to FIG. 5. Another end portion of the first conductive portion 321 is electrically connected to the N electrodes of the capacitor elements inside the case 31, and the first conductive portion 321 vertically extends to the outside from the front surface of the case 31. The first wiring portion 322 is approximately perpendicular to the first conductive portion 321 and extends in the direction of the third side portion 31a approximately in parallel with the front surface of the case 31. In addition, the portion of the first connection terminal 32 extending from the case 31 (the first wiring portion 322) has a comb-teeth like shape including a first connection portion 32a, a second connection portion 32b, and a third connection portion 32c in a planar view. In FIG. 4B, the reference characters of the first connection portion 32a, the second connection portion 32b, and the third connection portion 32c are not illustrated. The widths of the first connection portion 32a, the second connection portion 32b, and the third connection portion 32c correspond to the widths of the storage areas 21c1, 21c2, and 21c3 (the first power terminals 22a, 22b, and 22c) of the semiconductor module 20, respectively. The first connection terminal 32 is made of metal material having excellent electrical conductivity. Examples of the metal material include copper and a copper alloy.

Another end portion of the second connection terminal 34 is electrically connected to the P electrodes of all the capacitor elements within the case 31. An end portion of the second connection terminal 34 extends to the outside from the front surface of the case 31. The second connection terminal 34 is formed with a gap from the first connection terminal 32 and extends in the opposite direction of the third side portion 31a. The portion of the second connection terminal 34 extending from the case 31 has an approximately L shape in a lateral view. The second connection terminal 34 having the approximately L shape includes a second conductive portion 341 and a second wiring portion 342, as will be described with reference to FIG. 5. Another end portion of the second conductive portion 341 is electrically connected to the P electrodes of the capacitor elements within the case 31, and the second conductive portion 341 vertically extends to the outside from the front surface of the case 31. The second wiring portion 342 is approximately perpendicular to the second conductive portion 341 and extends to the opposite side of the third side portion 31a approximately in parallel with the front surface of the case 31. The second connection terminal 34 is made of metal material having excellent electrical conductivity. Examples of the metal material include copper and a copper alloy.

The second insulating sheet 33 is longer than the first connection terminal 32 and extends to the outside of the case 31 between the first connection terminal 32 and the second connection terminal 34. Thus, outside the case 31, the insulation between the first connection terminal 32 and the second connection terminal 34 is maintained by the second insulating sheet 33. The second insulating sheet 33 is made of flexible insulating material having insulating properties. For example, insulating paper made of wholly aromatic polyamide polymer or sheet insulating material made of fluorine or polyimide resin material may be used as the insulating material. In addition, a tip portion of the second insulating sheet 33 has a comb-teeth like shape including a first attachment portion 33a, a second attachment portion 33b, and a third attachment portion 33c in a planar view. In FIG. 4B, the reference characters of the first attachment portion 33a, the second attachment portion 33b, and the third attachment portion 33c are not illustrated. The widths of the first attachment portion 33a, the second attachment portion 33b, and the third attachment portion 33c correspond to the widths of the storage areas 21c1, 21c2, and 21c3 (the first insulating sheets 23a, 23b, and 23c) of the semiconductor module 20.

While not illustrated, additional terminals are formed in the case 31. These terminals have another end portion that is electrically connected to the positive and negative terminals of all the capacitor elements inside the case 31. These terminals have an end portion that extends to the outside from the case 31. These terminals may extend from any locations of the case 31, as long as the locations are different from where the first connection terminal 32 and the second connection terminal 34 extend. For example, these terminals may be formed on a side portion opposite to the third side portion 31a. The terminals are made of metal material having excellent electrical conductivity. Examples of the metal material include copper and a copper alloy.

Next, the coupling members 40a, 40b, and 40c will be described (see FIG. 1). Each of the coupling members 40a, 40b, and 40c has a planar shape in a planar view. The width of an end portion of each of the coupling members 40a, 40b, and 40c corresponds to the width of each of the storage areas 21c1, 21c2, and 21c3 (the second power terminals 24a, 24b, and 24c) of the semiconductor module 20. The thickness of each of the coupling members 40a, 40b, and 40c is less than the thickness of each of the second power terminals 24a, 24b, and 24c. The end portion of each of the coupling members 40a, 40b, and 40c is bonded to the corresponding one of the second power terminals 24a, 24b, and 24c by laser welding. Another end portion of each of the coupling members 40a, 40b, and 40c is bonded to the second connection terminal 34 of the capacitor 30 by seam laser. The bonding by laser welding may be performed by seam laser in which laser light is continuously emitted or spot laser in which pulsed laser light is emitted. FIG. 1 illustrates a case in which the bonding is made by seam laser. Thus, each of the coupling members 40a, 40b, and 40c in FIG. 1 has the linear laser welding mark 44a near the capacitor 30 and the linear laser welding mark 44b near the semiconductor module 20. The coupling members 40a, 40b, and 40c are made of metal material having excellent electrical conductivity. Examples of the metal material include copper and a copper alloy. According to the first embodiment, the three coupling members 40a, 40b, and 40c are bonded to the second power terminals 24a, 24b, and 24c, respectively. Alternatively, as is the case with the first connection terminal 32 and the second insulating sheet 33, a plate-like coupling member having an end portion in a comb-teeth like shape near the semiconductor module 20 may be used. In this case, the end portion has segments that correspond to the second power terminals 24a, 24b, and 24c.

Figure 5:
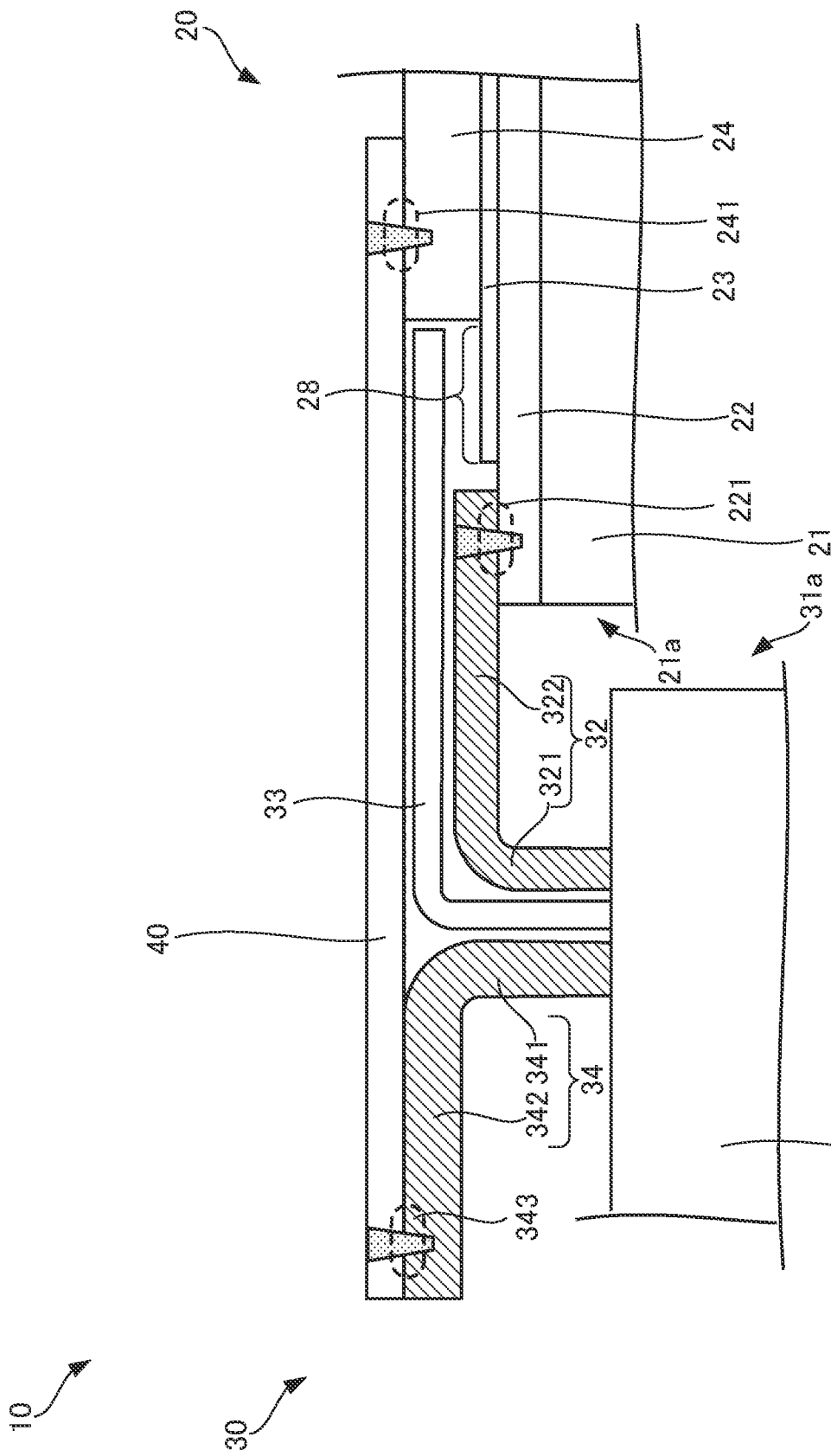
FIG. 5 is a sectional view illustrating a connection mechanism included in the semiconductor device according to the first embodiment.

Next, the connection mechanism between the semiconductor module 20 and the capacitor 30 of the semiconductor device 10 will be described with reference to FIG. 5. FIG. 5 is a sectional view illustrating the connection mechanism included in the semiconductor device according to the first embodiment. FIG. 5 is a sectional view taken along an alternate long and short dash line X-X in FIG. 1. The other coupling members 40b and 40c of the semiconductor device 10 in FIG. 1 have the same cross section as in FIG. 5.

In the semiconductor device 10, the first wiring portion 322 of the first connection terminal 32 of the capacitor 30 is bonded (physically connected) to a first bonding area 221 of the individual first power terminal 22 of the semiconductor module 20. Namely, while not illustrated, the first connection portion 32a, the second connection portion 32b, and the third connection portion 32c of the first wiring portion 322 of the first connection terminal 32 are bonded to the first bonding areas of the first power terminals 22a, 22b, and 22c of the semiconductor module 20. The term "first bonding area 221" collectively denotes any one of the first bonding areas of the first power terminals 22a, 22b, and 22c.

The second insulating sheet 33 of the capacitor 30 bends towards the semiconductor module 20 and extends over the first connection terminal 32. The tip portion of the second insulating sheet 33 extends above the terrace portions 28 of the first insulating sheets 23 of the semiconductor module 20. The tip portion of the second insulating sheet 33 extends up to a location immediately before the second power terminals 24. Namely, there is a gap between the individual terrace portion 28 and the tip portion of the second insulating sheet 33 and/or between the tip portion of the second insulating sheet 33 and the individual coupling member 40. In addition, the gap from the tip of the first connection terminal 32 to the tip of the individual second power terminal 24 is 6 mm or more and 12.5 mm or less. The individual terrace portion 28 extends towards the corresponding first bonding area 221 to be described below from the corresponding second bonding area 241 to be described below in a planar view. In addition, while not illustrated, the first attachment portion 33a, the second attachment portion 33b, and the third attachment portion 33c of the tip portion of the second insulating sheet 33 extend above the respective first insulating sheets 23a, 23b, and 23c of the semiconductor module 20.

The front surface of the second wiring portion 342 of the second connection terminal 34 of the capacitor 30 and the front surface of the individual second power terminal 24 of the semiconductor module 20 are on the same plane. In addition, an end portion of the individual coupling member 40 is bonded to a third bonding area 343 of the second wiring portion 342 of the second connection terminal 34 of the capacitor 30, and another end portion of the individual coupling member 40 is bonded to the second bonding area 241 of the corresponding second power terminal 24 of the semiconductor module 20. The coupling member 40 may form a current path from the second connection terminal 34 to the second power terminal 24. The second bonding areas 241 and the third bonding areas 343 are located in parallel with the first bonding areas 221. While not illustrated, another end portion of each of the coupling members 40a, 40b, and 40c is bonded to a corresponding one of the second bonding areas of the second power terminals 24a, 24b, and 24c of the semiconductor module 20. The second bonding area 241 collectively denotes any one of the second bonding areas of the second power terminals 24a, 24b, and 24c. In this way, the coupling members 40 electrically connect the second connection terminal 34 of the capacitor 30 and the second power terminals 24 of the semiconductor module 20. There is a gap between the rear surface of the individual coupling member 40 and the front surface of the first wiring portion 322 of the first connection terminal 32 of the capacitor 30. The second insulating sheet 33 is formed in this gap. Thus, the first connection terminal 32 is insulated from the coupling members 40 and the second connection terminal 34. The configuration of the second insulating sheet 33 is not limited to that illustrated in FIG. 5. For example, the second insulating sheet 33 may be in contact with the rear surface of the individual coupling member 40, the front surface of the first connection terminal 32, or the tip portions of the second power terminals 24 in this gap.

Figure 6:
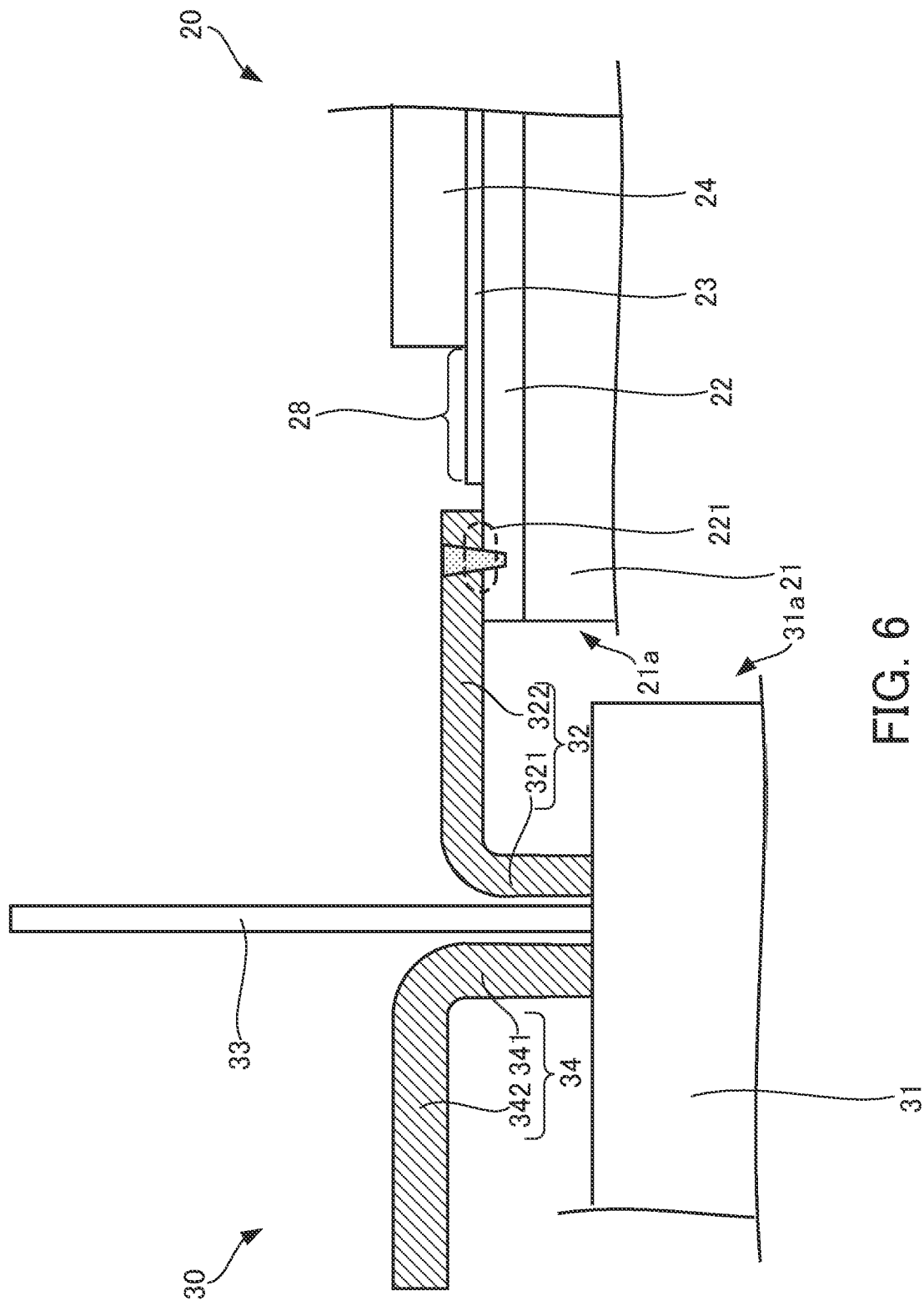
FIG. 6 is a sectional view illustrating a connection method of the semiconductor device according to the first embodiment.
Figure 7:
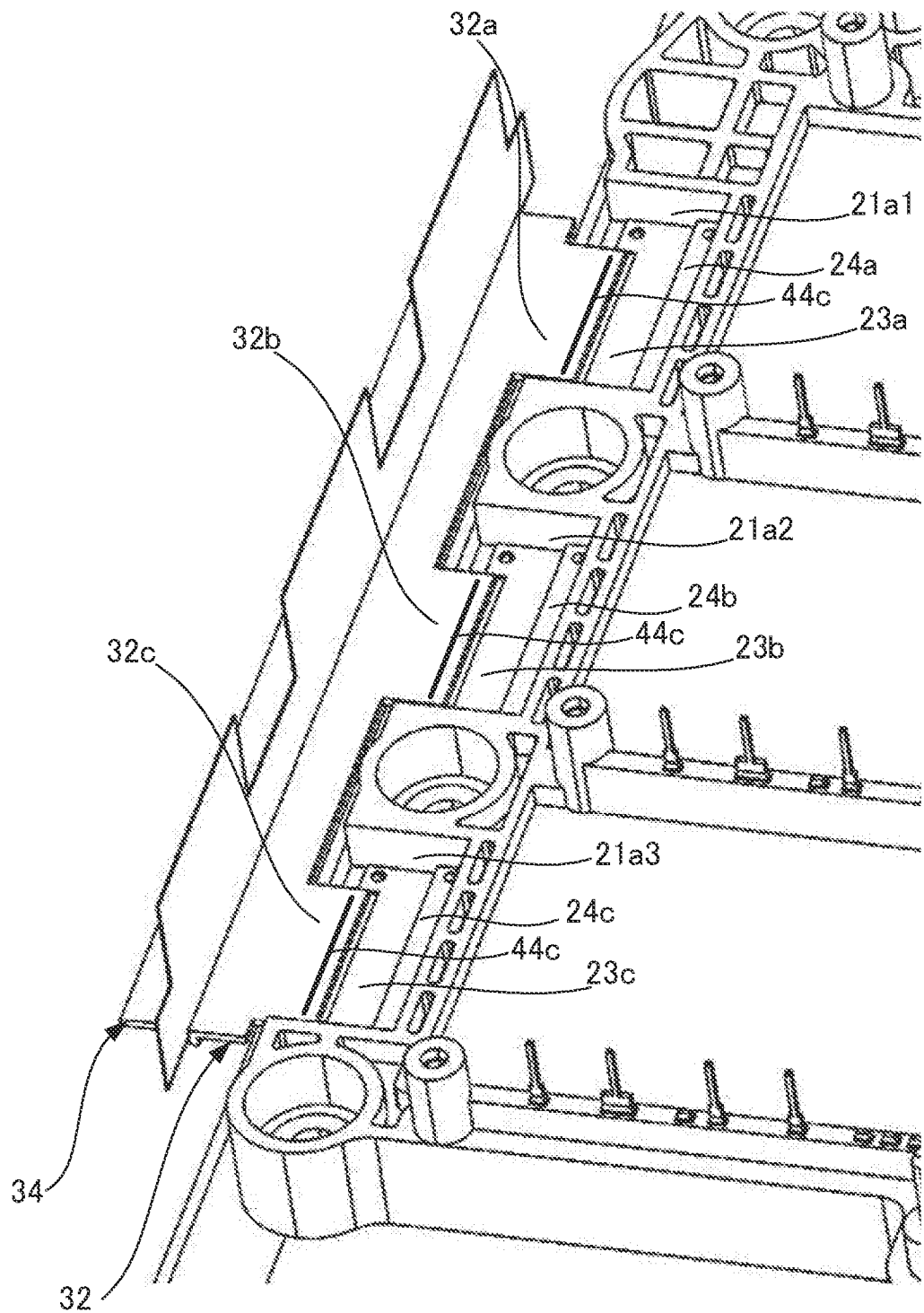
FIG. 7 is a perspective view illustrating the connection method of the semiconductor device according to the first embodiment.
Figure 8:
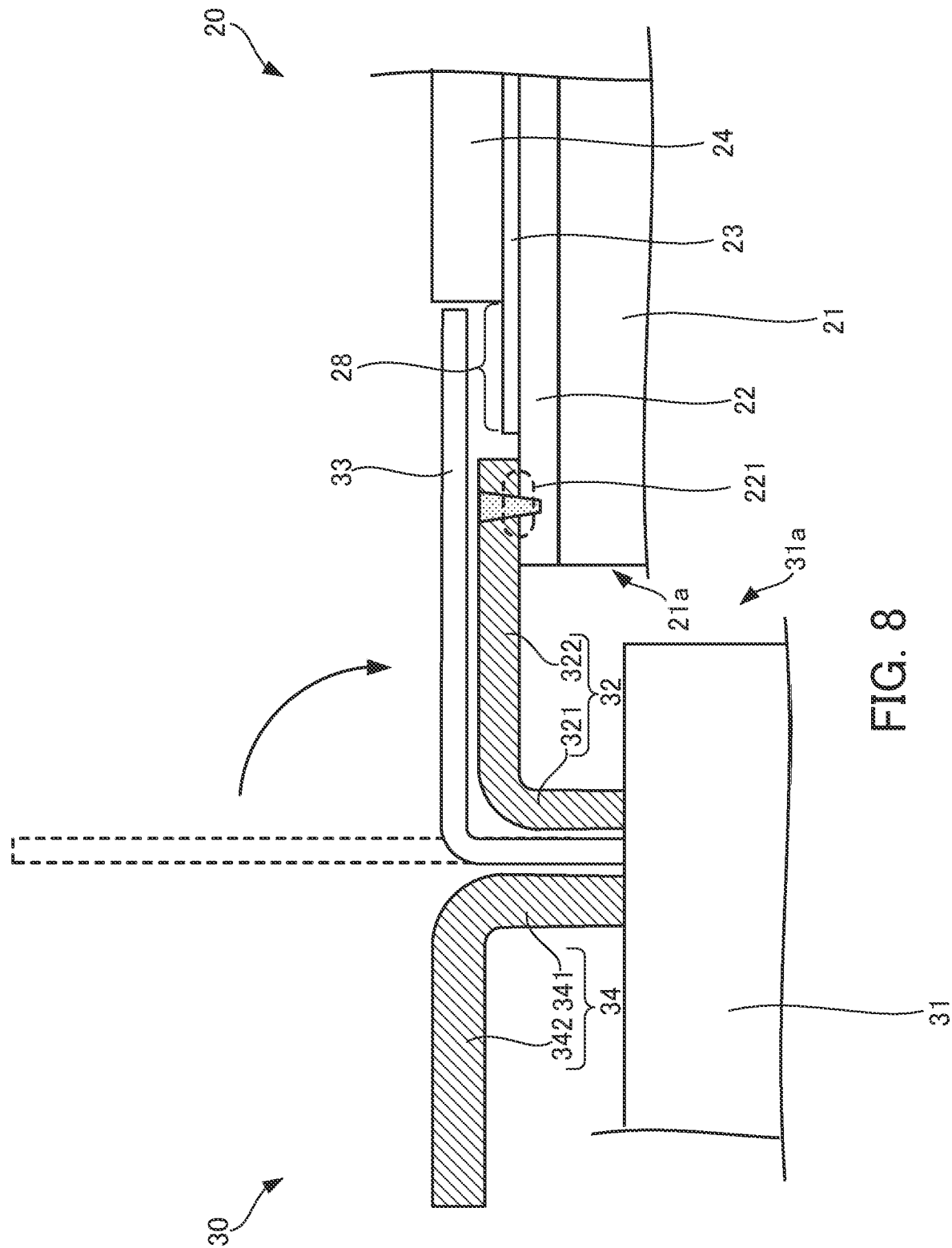
FIG. 8 is another sectional view illustrating the connection method of the semiconductor device according to the first embodiment.
Figure 9:
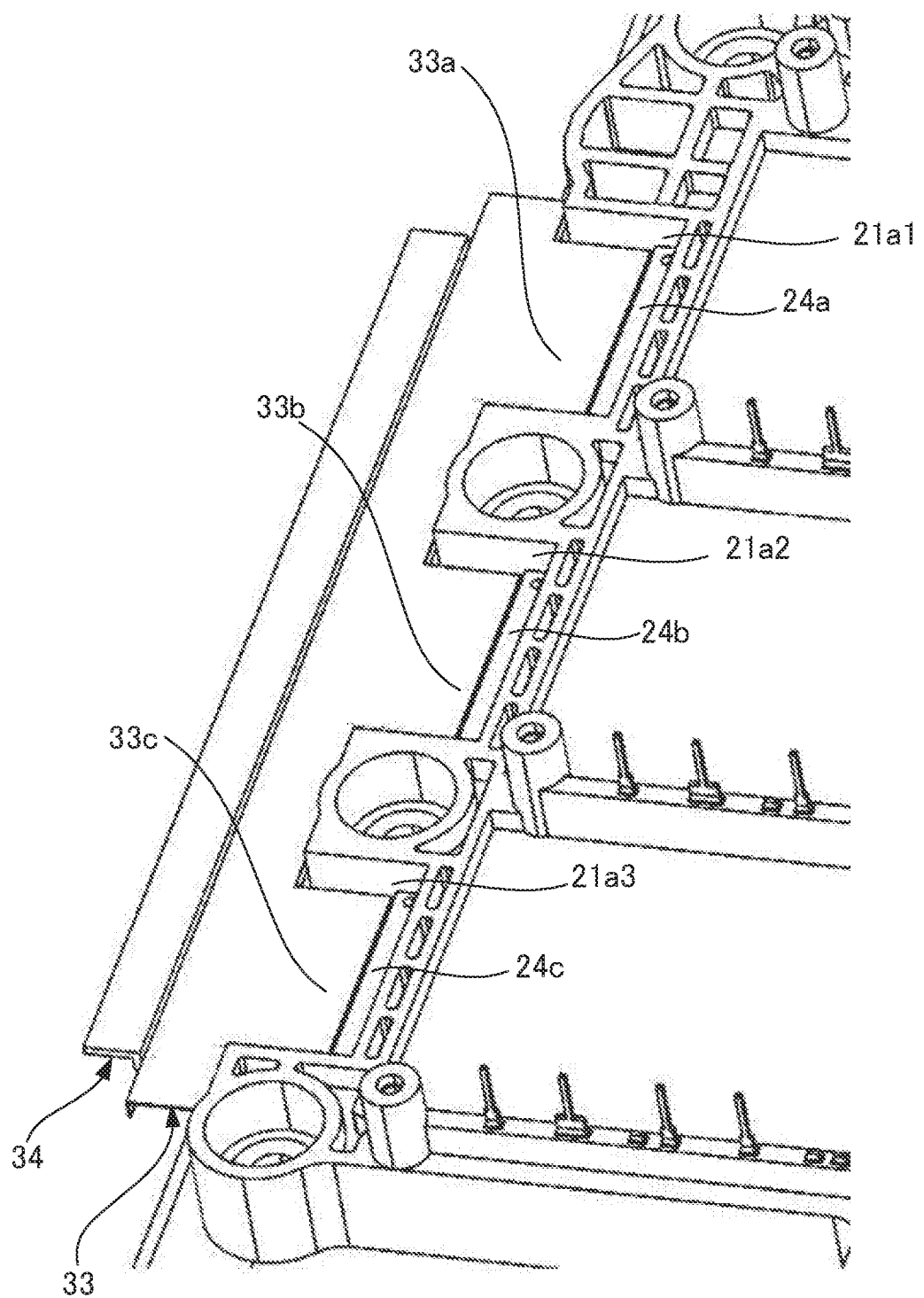
FIG. 9 is another perspective view illustrating the connection method of the semiconductor device according to the first embodiment.

Next, a connection method of the semiconductor module 20 and the capacitor 30 of the semiconductor device 10 will be described with reference to FIGS. 5, 6 and 9. FIGS. 6 and 8 are each a sectional view illustrating a connection method of the semiconductor device according to the first embodiment. FIGS. 7 and 9 are each a perspective view illustrating the connection method of the semiconductor device according to the first embodiment. FIGS. 6 and 8 correspond to the sectional view in FIG. 5. FIGS. 7 and 9 are each an enlarged perspective view of the connection between the semiconductor module 20 and the capacitor 30.

First, a tip portion of the first wiring portion 322 of the first connection terminal 32 of the capacitor 30 is positioned with respect to the first power terminals 22 of the semiconductor module 20. The front surface of the second wiring portion 342 of the second connection terminal 34 of the capacitor 30 and the front surfaces of the second power terminals 24 (the second power terminals 24a, 24b, and 24c) of the semiconductor module 20 are on the same plane. In this state, laser welding is performed to bond the tip portion of the first wiring portion 322 to the first bonding areas 221 of the first power terminals 22 (FIG. 6). In addition, as described above, the first wiring portion 322 has a comb-teeth like shape including the first connection portion 32a, the second connection portion 32b, and the third connection portion 32c in a planar view. Thus, the first connection portion 32a, the second connection portion 32b, and the third connection portion 32c of the first wiring portion 322 are bonded to the first bonding areas of the first power terminals 22a, 22b, and 22c in the terminal areas 21a1, 21a2, and 21a3, respectively (FIG. 7). Since located behind the first connection portion 32a, the second connection portion 32b, and the third connection portion 32c, the first power terminals 22a, 22b, and 22c are not illustrated in FIG. 7. In addition, in FIG. 7, a laser welding mark 44c is formed on each of the first connection portion 32a, the second connection portion 32b, and the third connection portion 32c of the first connection terminal 32. These laser welding marks 44c are also formed by seam laser or spot laser. FIG. 7 illustrates a case in which the bonding is made by seam laser.

Next, the second insulating sheet 33 of the capacitor 30 is bent towards the semiconductor module 20. Being flexible, the second insulating sheet 33 may be bent at once. After bent, the tip portion of the second insulating sheet 33 is located above the terrace portions 28 of the first insulating sheets 23 exposed to the outside between the first power terminals 22 and the second power terminals 24 of the semiconductor module 20 (FIG. 8). The bent second insulating sheet 33 may be in contact with the first power terminals 22, the first insulating sheets 23, or the second power terminals 24. In addition, as described above, the tip portion of the second insulating sheet 33 has a comb-teeth like shape including the first attachment portion 33a, the second attachment portion 33b, and the third attachment portion 33c in a planar view. Thus, the first attachment portion 33a, the second attachment portion 33b, and the third attachment portion 33c of the second insulating sheet 33 cover the first insulating sheets 23a, 23b, and 23c, respectively (FIG. 9). Since located behind the first attachment portion 33a, the second attachment portion 33b, and the third attachment portion 33c of the second insulating sheet 33, the first insulating sheets 23a, 23b, and 23c are not illustrated in FIG. 9.

Next, one end portion of the individual coupling member 40 is set on the front surface of the second wiring portion 342 of the second connection terminal 34 of the capacitor 30, and another end portion of the individual coupling member 40 is set on the front surface of the corresponding second power terminal 24 of the semiconductor module 20. Next, laser welding is performed to bond the one end portion of the individual coupling member 40 to the front surface of the corresponding second wiring portion 342 of the capacitor 30 and to bond the other end portion of the individual coupling member 40 to the front surface of the corresponding second power terminal 24 of the semiconductor module 20 (FIG. 5). Since the thickness of the individual coupling member 40 is less than the thickness of the individual second power terminal 24, the laser welding is performed more effectively. These coupling members 40a, 40b, and 40c are bonded to the second power terminals 24a, 24b, and 24c of the semiconductor module 20, respectively. The coupling members 40a, 40b, and 40c are also bonded to the second wiring portion 342 of the second connection terminal 34 of the capacitor 30 (FIG. 1). In this way, the semiconductor device 10 in which semiconductor module 20 and the capacitor 30 are coupled to each other is obtained.

The semiconductor device 10 includes the semiconductor module 20 and the capacitor 30. The capacitor 30 includes the case 31 including capacitor elements, the first connection terminal 32, the second connection terminal 34, and the second insulating sheet 33 formed between the first connection terminal 32 and the second connection terminal 34. The first connection terminal 32, the second insulating sheet 33, and the second connection terminal 34 extend to the outside from the case 31. The semiconductor module 20 includes the multi-layer terminal portions 25, each of which is formed by sequentially stacking the first power terminal 22, the first insulating sheet 23, and the second power terminal 24. The individual first power terminal 22 includes a first bonding area 221 electrically connected to the first connection terminal 32, and the individual second power terminal 24 includes a second bonding area 241 electrically connected to the second connection terminal 34 via the individual coupling member 40. The individual first insulating sheet 23 has a terrace portion 28 that extends in a direction from the corresponding second bonding area 241 (the second power terminal 24) towards the corresponding first bonding area 221 in a planar view.

The semiconductor module 20 and the capacitor 30 of the semiconductor device 10 are connected as close to each other as possible by the coupling members 40 and the first connection terminal 32. Thus, the length of an individual wiring between the semiconductor module 20 and the capacitor 30 is also as short as possible. Consequently, the inductance of the semiconductor device 10 is reduced. In addition, in accordance with this connection, the first connection terminal 32 and the coupling members 40 are arranged in parallel with each other. In this way, since the direction of the current flowing through the first connection terminal 32 is opposite to that of the current flowing through the individual coupling member 40, the magnetic field formed by these currents are offset. Thus, the inductance of the semiconductor device 10 is further reduced. Thus, compared with a case in which the semiconductor module 20 and the capacitor 30 of the semiconductor device 10 are connected to each other simply by screwing, the inductance is reduced more significantly.

Second Embodiment

Figure 10:
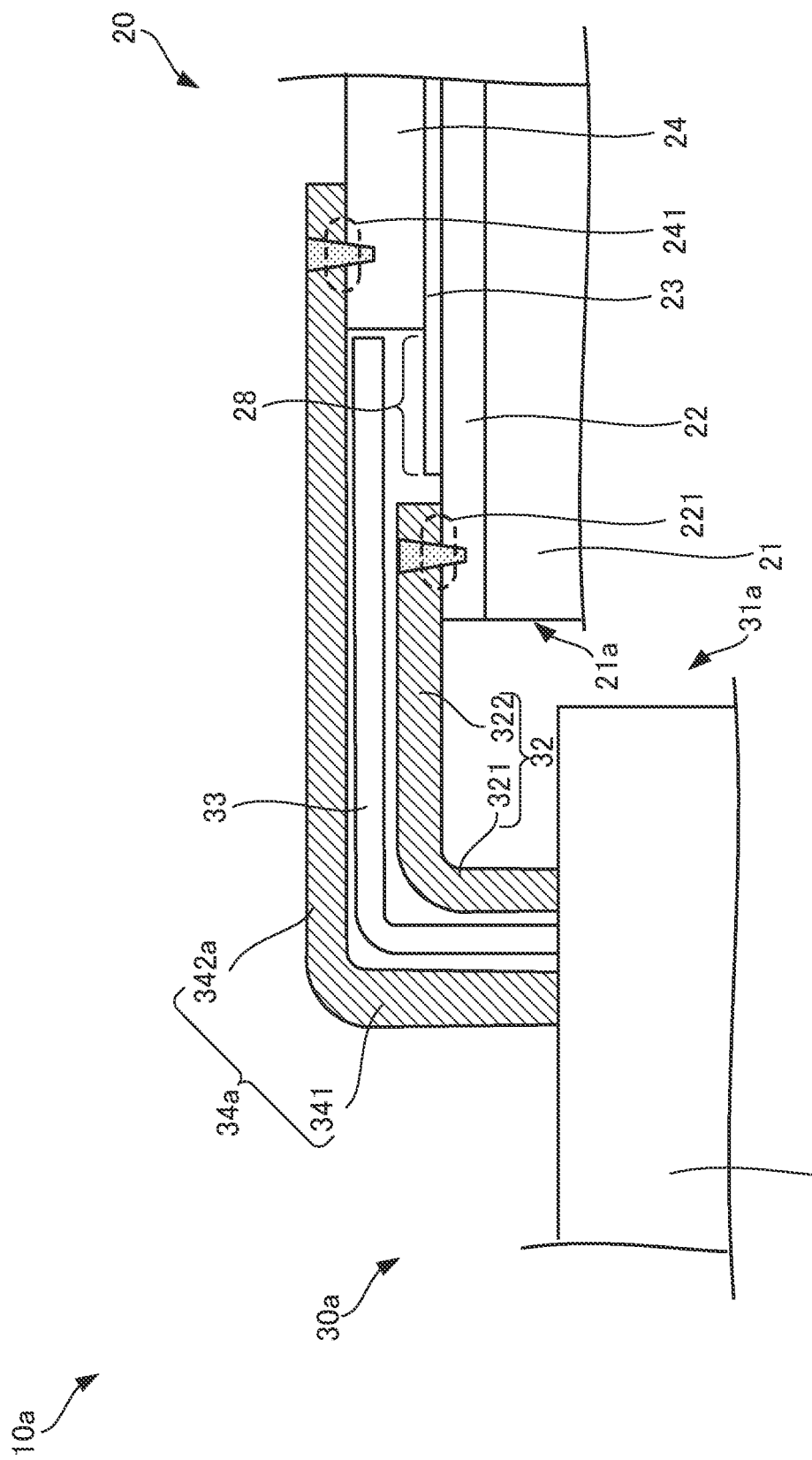
FIG. 10 is a sectional view illustrating a connection mechanism included in a semiconductor device according to a second embodiment.

A second embodiment will be described with reference to FIG. 10. According to the second embodiment, a semiconductor module and a capacitor are connected to each other by a connection mechanism different from that according to the first embodiment. FIG. 10 is a sectional view illustrating a connection mechanism included in a semiconductor device according to the second embodiment. FIG. 10 corresponds to the sectional view of the semiconductor device in FIG. 5 according to the first embodiment. According to the second embodiment, portions that are equivalent to those of the semiconductor device 10 according to the first embodiment will be denoted by the same reference characters, and description of these equivalent portions will be simplified or omitted.

This semiconductor device 10a includes a semiconductor module 20 and a capacitor 30a. The capacitor 30a includes a first connection terminal 32, a second insulating sheet 33, and a second connection terminal 34a. The second connection terminal 34a includes a second conductive portion 341 and a second wiring portion 342a. The second wiring portion 342a of the capacitor 30a extends in parallel with a first wiring portion 322 of the first connection terminal 32 towards a third side portion 31a. In addition, the second wiring portion 342a is bonded to an individual second power terminal 24 of the semiconductor module 20. Namely, the second connection terminal 34a of the capacitor 30a is directly bonded to the individual second power terminal 24 of the semiconductor module 20, without using the coupling members 40 according to the first embodiment. The second wiring portion 342a of the second connection terminal 34a has a comb-teeth like shape having segments in a planar view, as is the case with the first connection terminal 32. The tip portions of the comb-teeth like shape of the second wiring portion 342a of the second connection terminal 34a are bonded to second bonding areas of second power terminals 24a, 24b, and 24c of the semiconductor module 20. Namely, the second connection terminal 34a is bonded to a second bonding area 241 of the individual second power terminal 24 of the semiconductor module 20 as described above. Thus, the thickness of the second connection terminal 34a is less than that of the individual second power terminal 24. Thus, the second connection terminal 34a is effectively bonded to the second bonding area 241 of the individual second power terminal 24 by laser welding. The second embodiment assumes that the first connection terminal 32, the second connection terminal 34a, and the second insulating sheet 33 extend from the front surface of the case 31. However, alternatively, the first connection terminal 32, the second connection terminal 34a, and the second insulating sheet 33 may extend from the third side portion 31a of the case 31. In this case, the first connection terminal 32 and the second connection terminal 34a have a planar shape, instead of an approximately L shape. The second insulating sheet 33 extends in parallel with the planar first connection terminal 32 and second connection terminal 34a without being bent.

The semiconductor module 20 and the capacitor 30a of the semiconductor device 10a are also connected to as close to each other as possible by the first connection terminal 32 and the second connection terminal 34a. Thus, the length of an individual wiring between the semiconductor module 20 and the capacitor 30a is also as short as possible. Consequently, the inductance of the semiconductor device 10a is reduced. In addition, in accordance with this connection, the first connection terminal 32 and the second connection terminal 34a are formed in parallel with each other. In this way, since the direction of the current flowing through the first connection terminal 32 is opposite to that of the current flowing through the second connection terminal 34a, the magnetic field formed by these currents are offset. Thus, the inductance of the semiconductor device 10a is further reduced, and reduction of the reliability of the semiconductor device 10a is prevented. In addition, the semiconductor module 20 and the capacitor 30a of the semiconductor device 10a are connected to each other without using the coupling members 40 of the semiconductor device 10. Thus, the number of parts used is reduced, and the process of bonding the coupling members 40 is eliminated. Therefore, increase in the manufacturing cost of the semiconductor device 10a is prevented.

Third Embodiment

Figure 11:
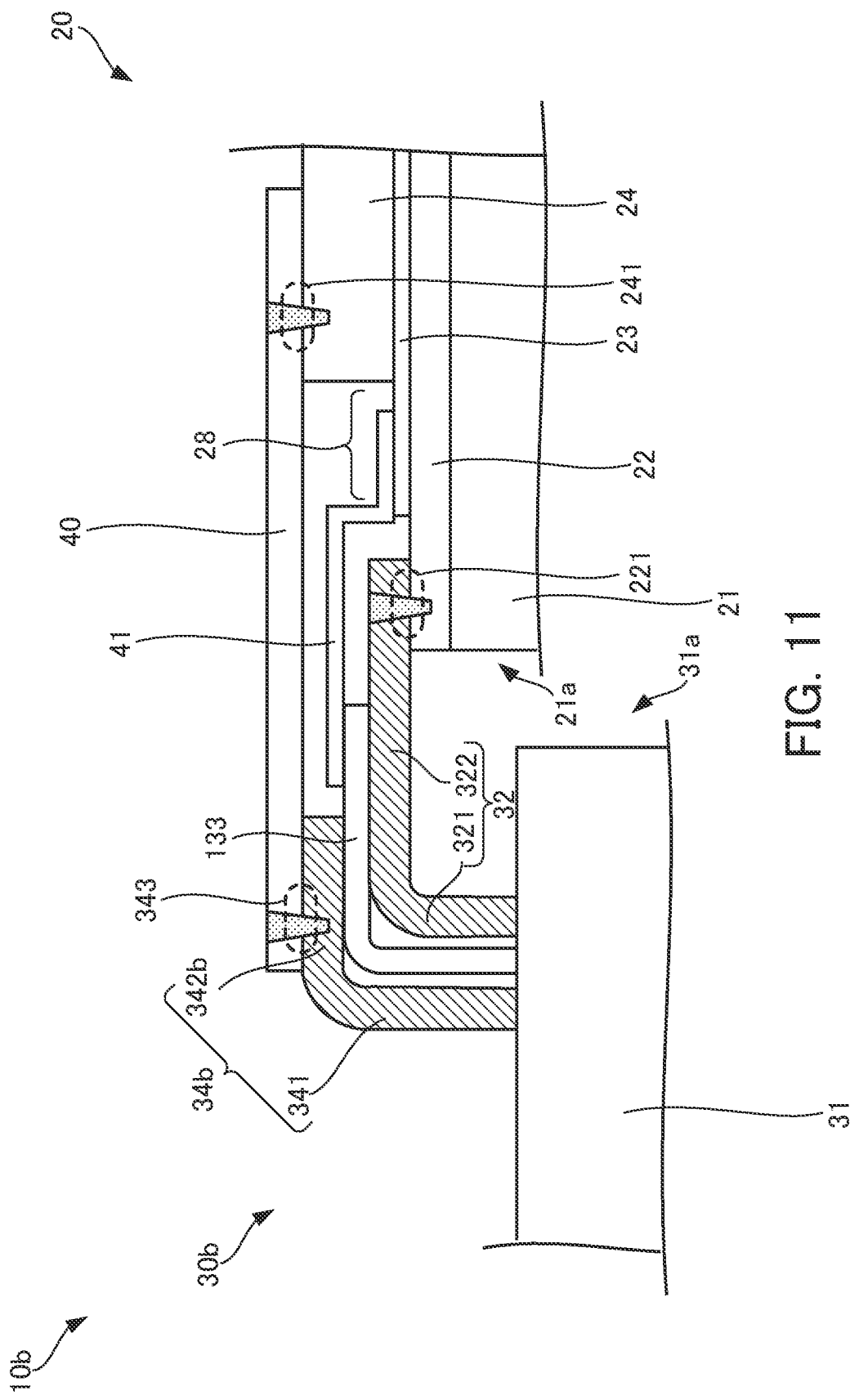
FIG. 11 is a sectional view illustrating a connection mechanism included in a semiconductor device according to a third embodiment.

A third embodiment will be described with reference to FIG. 11. According to the third embodiment, a semiconductor module and a capacitor are connected to each other by a connection mechanism different from those according to the first and second embodiments. FIG. 11 is a sectional view illustrating a connection mechanism included in a semiconductor device according to the third embodiment. FIG. 11 corresponds to the sectional view of the semiconductor device in FIG. 5 according to the first embodiment. According to the third embodiment, portions that are equivalent to those of the semiconductor device 10 or 10a according to the first or second embodiment will be denoted by the same reference characters, and description of these equivalent portions will be simplified or omitted.

This semiconductor device 10b includes a semiconductor module 20 and a capacitor 30b. The capacitor 30b includes a first connection terminal 32, a second insulating sheet 133, and a second connection terminal 34b. The second connection terminal 34b has a second conductive portion 341 and a second wiring portion 342b. The second wiring portion 342b of the capacitor 30b extends towards a third side portion 31a in parallel with a first wiring portion 322 of the first connection terminal 32. The second wiring portion 342b does not reach the plane of the third side portion 31a. In addition, the front surface of the second wiring portion 342b of the second connection terminal 34b and the front surface of an individual second power terminal 24 of the semiconductor module 20 are formed on the same plane. An end portion of an individual coupling member 40 is bonded to a corresponding second bonding area 241 on the front surface of the corresponding second power terminal 24, and another end portion of the individual coupling member 40 is bonded to a third bonding area 343 on the front surface of the second wiring portion 342b. In this way, the semiconductor module 20 and the capacitor 30b are electrically connected to each other.

In addition, the second insulating sheet 133 extends between the first connection terminal 32 and the second connection terminal 34b of the case 31. In FIG. 11, the second insulating sheet 133 extends above the front surface of the first connection terminal 32, and a tip portion of the second insulating sheet 133 is located between a tip portion of the first connection terminal 32 and a tip portion of the second connection terminal 34b. As a result, the insulation between the first connection terminal 32 and the second connection terminal 34b is maintained. A gap is formed between the front surface of the first wiring portion 322 of the first connection terminal 32 and the rear surface of the individual coupling member 40. In addition, a third insulating sheet (second insulating member) 41 is arranged in this gap. Namely, the third insulating sheet 41 is arranged between the tip portion of the second insulating sheet 133 located between the tip portion of the first connection terminal 32 and the tip portion of the second connection terminal 34b and tip portions of first insulating sheets 23. The third insulating sheet 41 is made of the same material as that of the second insulating sheet 133. In addition, an end portion of the third insulating sheet 41 is bonded to terrace portions 28 of the first insulating sheets 23, and another end portion of the third insulating sheet 41 is bonded to the tip portion of the second insulating sheet 133. Known adhesive is used for this bonding. The third insulating sheet 41 has an end portion near the semiconductor module 20, and this end portion has a comb-teeth like shape corresponding to storage areas 21c1, 21c2, and 21c3 of the semiconductor module 20 in a planar view. The third insulating sheet 41 has an end portion near the capacitor 30b, and this end portion has the same width as or a larger width than that of the second insulating sheet 133 in a planar view. The first connection terminal 32 is insulated from the second connection terminal 34b, the coupling members 40, and the second power terminals 24 by the second insulating sheet 133 and the third insulating sheet 41. The second insulating sheet 133 may be formed to cover the first connection terminal 32 and extend up to the first insulating sheet 23, as is the case with the second insulating sheet 33 in FIGS. 5 and 10. In this case, the end portion of the second insulating sheet 133, the end portion being near the semiconductor module 20, is formed to have a comb-teeth like shape, as is the case with the second insulating sheet 33 in FIGS. 5 and 10. In addition, in this case, the third insulating sheet 41 is not needed.

The semiconductor module 20 and the capacitor 30b of the semiconductor device 10b are connected as close to each other as possible by the first connection terminal 32 and the coupling members 40. Thus, the length of an individual wiring between the semiconductor module 20 and the capacitor 30b is also as short as possible. Consequently, the inductance of the semiconductor device 10b is reduced. In addition, in accordance with this connection, the first connection terminal 32 and the coupling members 40 are arranged in parallel with each other. In this way, since the direction of the current flowing through the first connection terminal 32 is opposite to that of the current flowing through the individual coupling member 40, the magnetic field formed by these currents are offset. Thus, the inductance of the semiconductor device 10b is further reduced.

Fourth Embodiment

Figure 12:
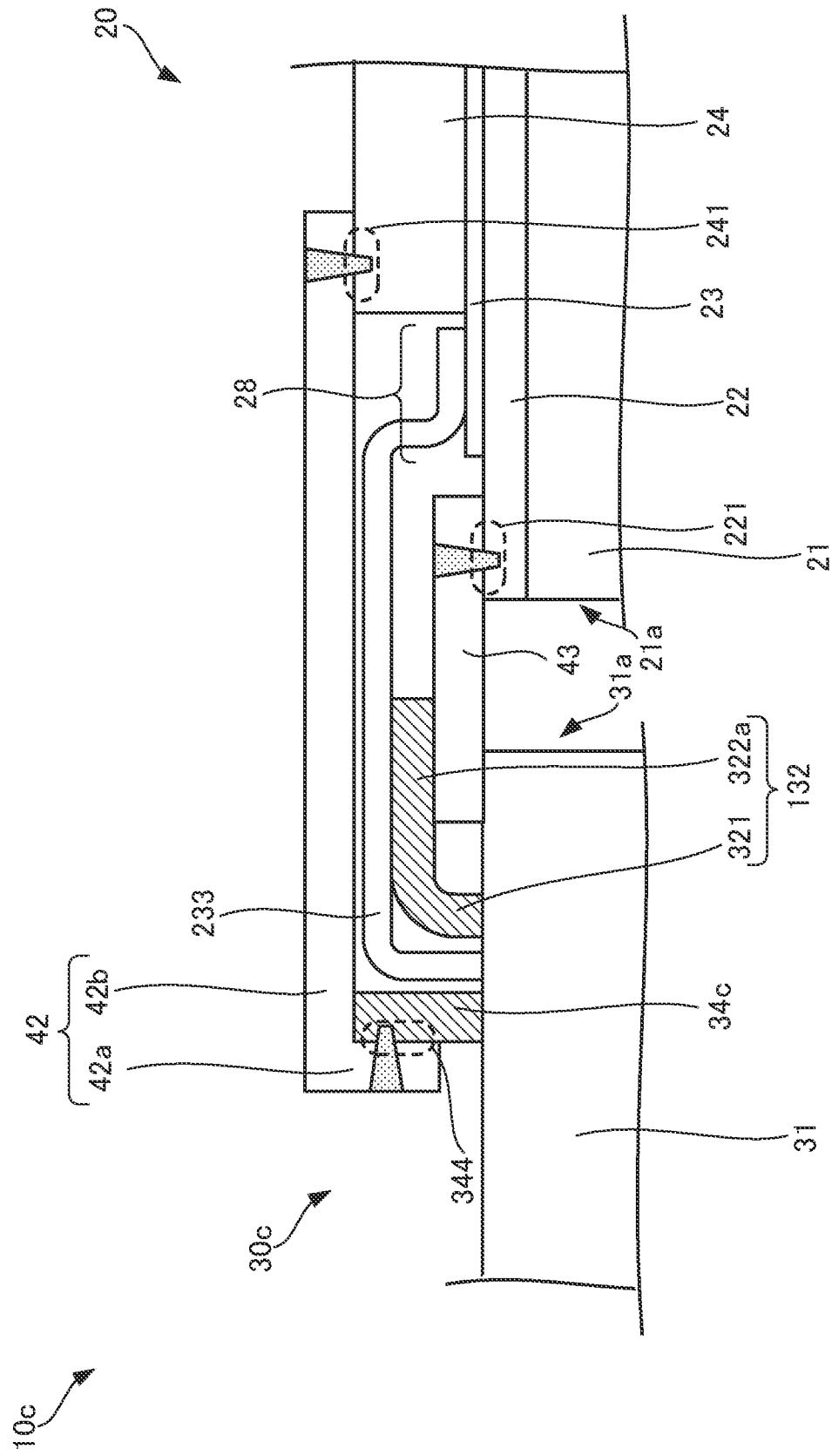
FIG. 12 is a sectional view illustrating a connection mechanism included in a semiconductor device according to a fourth embodiment.

A fourth embodiment will be described with reference to FIG. 12. According to the fourth embodiment, a semiconductor module and a capacitor are connected to each other by a connection mechanism different from those according to the first to third embodiments. FIG. 12 is a sectional view illustrating a connection mechanism included in a semiconductor device according to the fourth embodiment. FIG. 12 corresponds to the sectional view of the semiconductor device in FIG. 5 according to the first embodiment. According to the fourth embodiment, portions that are equivalent to those of the semiconductor device 10, 10a, or 10b according to the first, second, or third embodiment will be denoted by the same reference characters, and description of these equivalent portions will be simplified or omitted.

This semiconductor device 10c includes a semiconductor module 20 and a capacitor 30c. The capacitor 30c includes a first connection terminal 132, a second insulating sheet 233, and a second connection terminal 34c. The first connection terminal 132 has a first conductive portion 321 and a first wiring portion 322a. The first wiring portion 322a extends towards a third side portion 31a in parallel with the front surface of a case 31. The first wiring portion 322a extends up to a location slightly beyond the third side portion 31a. In addition, the first wiring portion 322a of the first connection terminal 132 has a comb-teeth like shape in a planar view, as is the case with the first connection terminal 32. The second connection terminal 34c extends upwards from the front surface of the case 31. A tip of the second connection terminal 34c and the front surface of an individual second power terminal 24 of the semiconductor module 20 are on the same plane. In addition, a coupling member 43 is formed between the third side portion 31a of the case 31 of the capacitor 30c and an individual first power terminal 22 of the semiconductor module 20 of the semiconductor device 10c. The rear surface of an end portion of the individual coupling member 43 is electrically connected to a first bonding area 221 of the individual first power terminal 22. The front surface of another end portion of the coupling member 43 is electrically connected to the rear surface of the first wiring portion 322a of the first connection terminal 132. In addition, the coupling member 43 is connected to first power terminals 22a, 22b, and 22c of the semiconductor module 20.

In addition, the second insulating sheet 233 extends between the first connection terminal 132 and the second connection terminal 34c of the case 31, convers the first connection terminal 132 and the coupling member 43, and is connected to terrace portions 28 of first insulating sheets 23 of the semiconductor module 20. Thus, the insulation between the second connection terminal 34c and the first connection terminal 132 is maintained.

An individual coupling member 42 has an approximately L shape in a lateral view and has an engaging portion 42a and a third wiring portion 42b. The rear surface of an end portion of the third wiring portion 42b of the coupling member 42 is bonded to a second bonding area 241 on the front surface of a corresponding individual second power terminal 24 of the semiconductor module 20. The engaging portion 42a of the individual coupling member 42 is hung over (engaged with) the second connection terminal 34c of the capacitor 30c and is bonded to a fourth bonding area 344 on a side portion (the left portion in FIG. 12) of the second connection terminal 34c. These coupling members 42 electrically connect the second power terminals 24 of the semiconductor module 20 and the second connection terminal 34c of the capacitor 30c. In addition, each of these coupling members 42 is provided for a corresponding one of the second power terminals 24a, 24b, and 24c of the semiconductor module 20. A gap is formed between the rear surface of the individual coupling member 42 (the third wiring portion 42b) and the front surface of first connection terminal 132 and the front surface of the individual coupling member 43. The second insulating sheet 233 is disposed in this gap. Thus, the insulation between a coupling member 42 and a corresponding combination of the first connection terminal 132 and the coupling members 43 is maintained. In addition, the insulation between a second power terminal 24 and a corresponding combination of the first connection terminal 132 and the coupling member 43 is maintained.

The semiconductor module 20 and the capacitor 30c of the semiconductor device 10c are also connected as close to each other as possible by the first connection terminal 132, the coupling members 43, and the coupling members 42. In particular, the individual coupling member 42 is shorter than the individual coupling member 40 according to the first embodiment. Thus, the length of an individual wiring between the semiconductor module 20 and the capacitor 30c is also as short as possible. Consequently, the inductance of the semiconductor device 10c is further reduced. In addition, in accordance with this connection, the first connection terminal 132, the coupling members 43, and the coupling members 42 are arranged in parallel with each other. In this way, since the direction of the current flowing through the first connection terminal 132 and the coupling members 43 is made opposite to the current flowing through the coupling members 42, the magnetic field formed by these currents are offset. Thus, the inductance of the semiconductor device 10c is further reduced.

According to the embodiments discussed above, the inductance between a semiconductor module and a capacitor is reduced.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A method of manufacturing a semiconductor device, comprising
    preparing a capacitor including a first connection terminal and a second connection terminal, wherein the first connection terminal and the second connection terminal extend to an outside;
    preparing a semiconductor module including a multi-layer terminal portion in which a first power terminal, a first insulating member, and a second power terminal are sequentially stacked, the multi-layer terminal portion being at least partially exposed to the outside, the first insulating member including a terrace portion extending from an end portion of the second power terminal toward the first connection terminal; and
    electrically and physically connecting the first connection terminal to the first power terminal by laser welding.

2. The method of manufacturing the semiconductor device according to claim 1, further comprising electrically and physically connecting the second connection terminal to the second power terminal by the laser welding.

3. The method of manufacturing the semiconductor device according to claim 1, further comprising electrically and physically connecting a coupling member to both the second connection terminal and the second power terminal by the laser welding.

4. The method of manufacturing the semiconductor device according to claim 1, wherein
the capacitor further includes a second insulating member between the first connection terminal and the second connection terminal, and
the method further includes arranging the second insulating member such that the second insulating member overlaps the terrace portion in a plan view of the semiconductor device.

5. The method of manufacturing the semiconductor device according to claim 1, wherein the laser welding is performed by seam laser or spot laser.

* * * * *